United States Patent [19]
Yajima

[11] Patent Number: 6,025,039
[45] Date of Patent: Feb. 15, 2000

[54] METHOD FOR PRODUCING A PHOTOVOLTAIC CELL

[75] Inventor: Takahiro Yajima, Soraku-gun, Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/719,274

[22] Filed: Sep. 24, 1996

[30] Foreign Application Priority Data

Sep. 28, 1995 [JP] Japan .................................. 7-250711

[51] Int. Cl.[7] .................................................. H05H 1/20
[52] U.S. Cl. ........................... 427/573; 427/569; 438/96; 438/97
[58] Field of Search ...................... 136/249 TJ, 258 AM; 257/53, 55, 458, 440, 436; 438/96, 97; 427/573, 569, 574, 578

[56] References Cited

U.S. PATENT DOCUMENTS

| | | | |
|---|---|---|---|
| 4,664,951 | 5/1987 | Doehler | 427/248 |
| 5,021,103 | 6/1991 | Hamakawa et al. | 148/33 |
| 5,091,764 | 2/1992 | Asaoka et al. | 257/55 |
| 5,266,116 | 11/1993 | Fujioka et al. | 136/258 |
| 5,419,783 | 5/1995 | Noguchi et al. | 136/258 AM |
| 5,468,521 | 11/1995 | Kanai et al. | 136/258 |
| 5,571,749 | 11/1996 | Matsuda et al. | 136/258 |
| 5,589,007 | 12/1996 | Fujioka et al. | 136/258 |
| 5,946,587 | 8/1999 | Fujioka et al. | 438/513 |

FOREIGN PATENT DOCUMENTS

| | | | |
|---|---|---|---|
| 61-135167 | 6/1986 | Japan | 136/258 AM |
| 2-218175 | 8/1990 | Japan | 136/258 AM |
| 3-4569 | 1/1991 | Japan | 136/258 AM |
| 3-4570 | 1/1991 | Japan | 136/258 AM |
| 5-275725 | 10/1993 | Japan | 136/258 AM |

OTHER PUBLICATIONS

S. Guha et al, *Appl. Phys. Lett.*, vol. 49, No. 4, Jul. 28, 1986, pp. 218–219.

*Primary Examiner*—Nam Nguyen
*Assistant Examiner*—Steven H. Ver Steeg
*Attorney, Agent, or Firm*—Fitzpatrick, Cella, Harper & Scinto

[57] ABSTRACT

A photovoltaic cell comprising a substrate, an n-layer, an i-layer, and a p-layer, wherein the p-layer comprises a first p-layer including micro-crystals adjacent to the i-layer and a second, amorphous p-layer stacked on the first p-layer. A photovoltaic cell is provided in which carrier injection from the upper electrode into the p-layer can be suppressed to obtain a high open circuit voltage.

5 Claims, 5 Drawing Sheets

METHOD FOR PRODUCING A PHOTOVOLTAIC CELL

BACKGROUND OF THE INVENTION

1. Field of the Invention

The present invention relates to a photovoltaic cell comprising a non-monocrystalline semiconductor.

2. Related Background Art

A photovoltaic cell comprising a non-monocrystalline semiconductor generally has a pin junction. Generally such a photovoltaic cell has a p-layer as a window layer, i.e., on the light incident side.

According to S. Guha, J. Yang, P. Nath and M. Hack, "Enhancement of open circuit voltage in high efficiency amorphous silicon alloy solar cells", Appl. Phys. Lett., 49 (1986) 218, by using the physical properties of microcrystalline silicon ($\mu$c-Si:H) such as a high conductivity and a small absorption coefficient in the short wavelength region, $\mu$c-Si:H is used as the p-layer on the light incident side to reduce the short circuit current ($J_{sc}$). In addition, since $\mu$c-Si:H has a wider gap than that of a-Si:H, it has a high impurity doping efficiency, and the internal electric field in a photovoltaic cell using $\mu$c-Si:H increases. As a result, this improves the open circuit voltage ($V_{oc}$) and the photoelectric conversion efficiency ($\eta$).

When the p-layer on the light incident side consisting of $\mu$c-Si:H is forward-biased, however, injection of holes from the upper electrode is promoted, because the p-layer has a low activation energy, thereby increasing the dark current. Therefore, it may occur that the open circuit voltage $V_{oc}$ once raised by the use of $\mu$c-Si:H in the p-layer drops again. The present inventor speculated that a higher open circuit voltage $V_{oc}$ may be obtained when the above problem is solved, thereby achieving the present invention.

SUMMARY OF THE INVENTION

It is an object of the present invention to provide a photovoltaic cell in which carrier injection into a p-layer on the light incident side is suppressed to obtain a high open circuit voltage ($V_{oc}$).

DETAILED DESCRIPTION OF THE PREFERRED EMBODIMENTS

Figure 1:
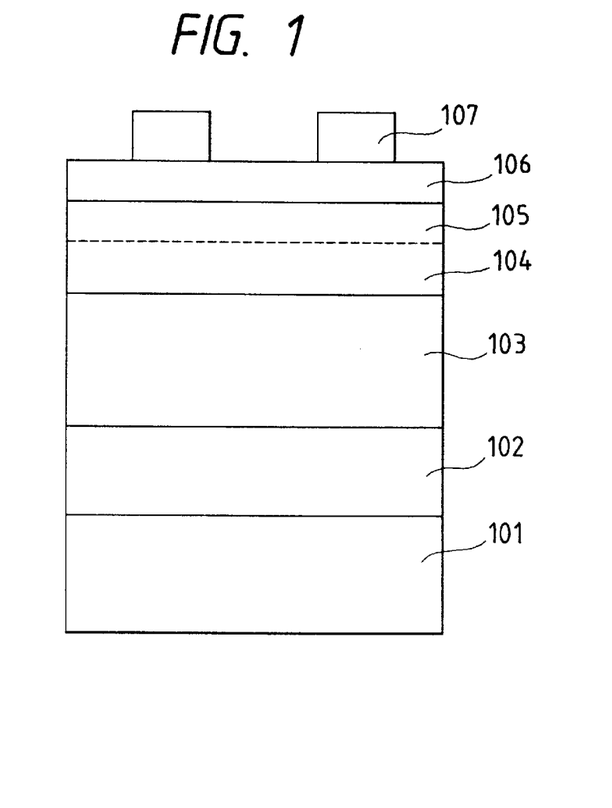
FIG. 1 is a sectional view illustrating a single-cell photoelectric conversion element according to the present invention.

As shown in FIG. 1, a photovoltaic cell according to the present invention comprises, on a substrate 101, an n-layer 102, an i-layer 103, a first p-layer 104 consisting of a crystalline material, a second p-layer 105 including an amorphous material, a transparent conductive layer 106, and an electrode 107. According to the present invention, the p-layer located on the light incident side comprises the first p-layer 104 having a junction with the i-layer 103 and containing a crystalline material, and the second p-layer 105 having a junction with the electrode 107 and including an amorphous material. With this structure, there can be provided a photovoltaic cell in which carrier injection from the upper electrode can be suppressed to obtain a high open circuit voltage $V_{oc}$.

The n-layer and the i-layer are formed by RF plasma CVD, while the p-layer is formed by low-frequency plasma CVD. An apparatus for manufacturing a photovoltaic cell according to the present invention is preferably a roll-to-roll apparatus shown in FIG. 2.

Figure 2:
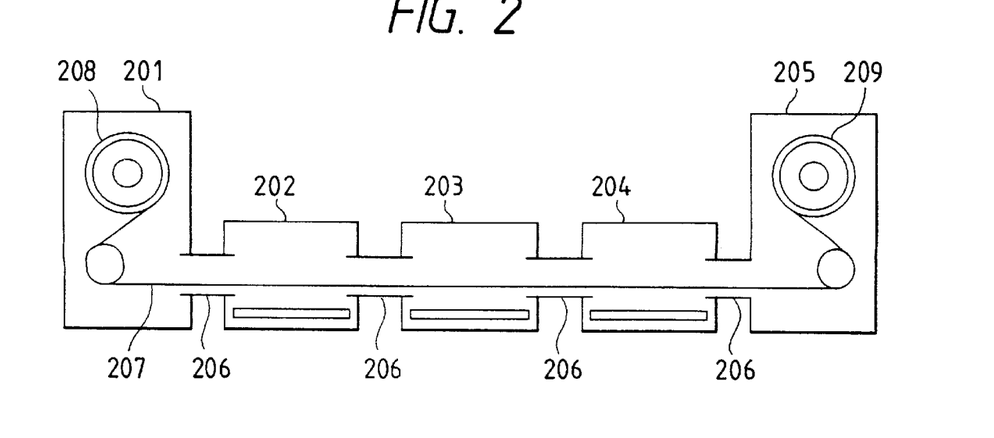
FIG. 2 is a view illustrating a roll-to-roll film forming apparatus used to manufacture the single-cell photoelectric conversion element shown in FIG. 1.

The n-, i-, and p-layers are respectively formed in chambers 202, 203, and 204, while an elongated substrate 207 is being moved from a roll 208 to a roll 209. The deposition chamber for the p-layer of the present invention is shown in FIG. 3.

Figure 3:
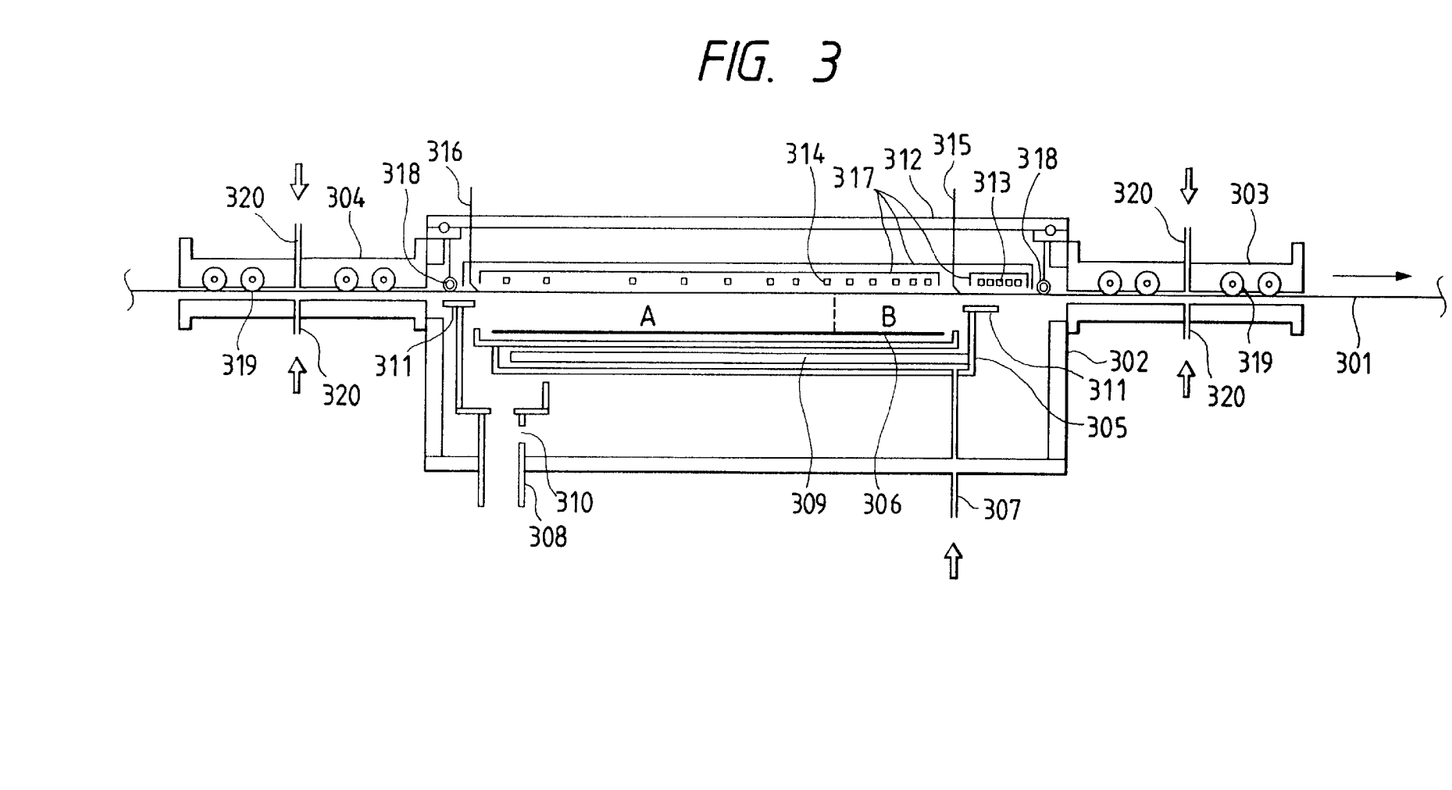
FIG. 3 is a view showing a parallel plate capacitive coupling plasma CVD apparatus constituting part of the roll-to-roll film forming apparatus shown in FIG. 2.

In the p-layer deposition chamber shown in FIG. 3, a semiconductor layer containing a crystalline material is formed in a plasma A on the gas exhaust side, while an amorphous semiconductor layer is formed in a plasma B on the gas supply side.

A raw material or source gas is supplied through a gas supply pipe 307. The interior of a chambers 312 is evacuated to a desired internal pressure through an exhaust pipe 308. A substrate 301 is heated by heaters 313 and 314, and the temperature of the substrate 301 is monitored by thermocouples 315 and 316 and kept at a predetermined value. The chambers 312 is coupled to the i-layer deposition chamber through a gas gate 304 and to the substrate take-up chamber through a gas gate 303. Each gas gate comprises a scavenger or purge gas supply pipe 320 and magnetic conveyor rollers 319. The raw material gas is heated by a block heater 309 and reaches a discharge chambers 305. An RF or low-frequency voltage is applied to a discharge electrode 306 to generate the plasmas A and B, thereby performing film formation.

In the photovoltaic cell of the present invention, since the first p-layer contains a crystalline material and has a wider band gap than that of a crystalline layer and a lower activation energy than an amorphous material, a larger internal electric field can be obtained to result in a high open circuit voltage $V_{oc}$. However, since the activation energy is low, carrier injection from the upper electrode is enhanced to decrease the open circuit voltage $V_{oc}$. In order to prevent this, the thin second p-layer consisting only of an amorphous material is formed on the surface of the first p-layer, thereby suppressing carrier injection from the upper electrode and obtaining a high open circuit voltage $V_{oc}$.

The constituent elements of the present invention will be described with reference to FIG. 1.

Substrate

The electrical nature of the substrate 101 may be conductive or insulative. The optical nature of the substrate 101 may be transparent or opaque. Preferable examples of the conductive substrate are copper, iron, aluminum, and stainless steel. Preferable examples of the insulating substrate are a resin (e.g., polyimide), glass, and ceramics.

When the substrate is made of a metal or the like and electrically conductive, the substrate itself may be directly used as a current output electrode. However, when the substrate is made of a synthetic resin and electrically insulative, it is preferable that a current output electrode consisting of a metal, an alloy, or a transparent conductive oxide (TCO) be formed by sputtering or the like on the substrate surface on which a semiconductor film is to be formed. Preferable examples of the metal are Al and Ag, and preferable examples of the TCO are zinc oxide, indium oxide, tin oxide, and ITO.

When the substrate is an opaque substrate made of a metal or the like, a conductive reflection layer of Al, Ag, or the like is preferably formed on the substrate to increase the reflectance of long-wavelength light on the substrate surface. A TCO such as ZnO or ITO is preferably formed between the conductive reflection film and the semiconductor layer to prevent mutual diffusion of the constituent elements between the substrate material and the semiconductor film and to form a short circuit preventing buffer layer. When the substrate is relatively transparent and forms part of a solar cell having a layered structure on which light is incident from the substrate side, it is preferable that a transparent conductive oxide as described above or a conductive thin film of a metal or the like be deposited in advance.

The surface of the conductive reflection film or TCO of the substrate may be a smooth surface or a slightly corrugated surface, i.e., a surface having a so-called texture. The use of an elongated substrate allows use of the roll-to-roll apparatus shown in FIG. 2.

Power Generation Layer

A power generation layer according to the present invention has a structure consisting of a non-monocrystalline semiconductor and including at least one pin junction. The term non-monocrystalline means an amorphous, microcrystalline, or a polycrystalline substance, or a mixture thereof.

A silicon-based material is suitably used for the power generation layer.

The n-layer 102 consists of an n-type silicon-based non-monocrystalline semiconductor obtained by decomposition of a gas mixture of $SiH_4$, $H_2$, and $PH_3$ by plasma CVD.

The i-layer 103 consists of a substantially intrinsic silicon-based non-monocrystalline semiconductor obtained by decomposition of a gas mixture of $SiH_4$, $GeH_4$, $CH_4$, $C_2H_4$, and $H_2$ by plasma CVD.

The first p-layer 104 consists of an amorphous semiconductor containing a p-type silicon-based crystalline material obtained by decomposition of a gas mixture of $SiH_4$, $H_2$, $BF_3$, and $B_2H_6$ by plasma CVD.

The second p-layer 105 consists of a p-type silicon-based amorphous semiconductor obtained by decomposition of a gas mixture of $SiH_4$, $H_2$, $BF_3$, and $B_2H_6$ by plasma CVD.

The thickness of the first p-layer preferably falls within the range of 2 to 50 nm, and the thickness of the second p-layer preferably falls within the range of 1 to 20 nm. The first and second p-layers may be doped with an element such as carbon or nitrogen to widen the band gap in order to minimize light absorption in these layers.

Transparent Conductive Layer

The transparent conductive layer 106 according to the present invention may consist of a transparent conductive oxide such as ITO or ZnO, or a conductive film made of a metal or the like thin enough to transmit light.

Electrode

The electrode 107 is obtained by printing and hardening a conductive paste or fixing a metal wire with a conductive paste. Preferable examples of the conductive paste are ones containing Ag and C, and a preferable example of the metal wire is Cu. A Cu wire coated with Ag is more preferable as the metal wire.

EXAMPLES

The photovoltaic cells according to the present invention will be described by way of examples, but the present invention is not limited thereto.

Example 1

Example 1 will illustrate a method of manufacturing a photovoltaic cell in which the p-layer contacting the transparent conductive layer shown in FIG. 1 has a two-layered structure. The photovoltaic cell of Example 1 was manufactured by a conventional parallel plate capacitive coupling plasma CVD apparatus.

The manufacturing process will be described below.

(1) A 10-nm thick n-layer 102 consisting of an n-type a-Si:H film was formed on a stainless steel substrate (size: 50 mm×100 mm) 101 by RF plasma CVD.

(2) A 120-nm thick i-layer 103 consisting of a substantially intrinsic a-Si:H film was formed on the n-layer 102 by RF plasma CVD.

(3) A 10-nm thick first p-layer 104 consisting of a p-type $\mu$c-Si:H film was formed on the i-layer 103 by low-frequency plasma CVD.

(4) A 2-nm thick second p-layer 105 consisting of a p-type a-Si:H film was formed on the first p-layer 104 by low-frequency plasma CVD.

Table 1 shows the film forming conditions in steps (1) to (4).

TABLE 1

| Semiconductor Layer | 102 | 103 | 104 | 105 |
|---|---|---|---|---|
| Forming Method | RF plasma CVD | RF plasma CVD | low-frequency CVD | low-frequency CVD |
| Conductivity Type | n-type | i-type | p-type | p-type |
| Crystal Form | amorphous | amorphous | microcrystalline | amorphous |
| Material | Si | Si | Si | Si |
| Film Thickness (nm) | 200 | 1000 | 100 | 20 |
| Raw Material Gas (sccm) | | | | |
| $SiH_4$ | 150 | 160 | 5 | 5 |
| $PH_4$ | 300 | — | — | — |
| $BF_3$ | — | — | 0.1 | 0.8 |
| $H_2$ | 1500 | 2000 | 2000 | 2000 |
| Internal Pressure of Film Forming Chamber (Pa) | 130 | 135 | 130 | 130 |
| Substrate Temperature (° C.) | 300 | 250 | 100 | 100 |
| Discharge Power (W) | RF 13.56 MHz 150 | RF 13.56 MHz 400 | low-frequency 75 kHz 600 | low-frequency 75 kHz 400 |

The substrate on which the layers up to the layered semiconductor film were formed as described above was cut into a portion having an area of 50 cm², and 50 transparent conductive layers as upper electrodes each consisting of an ITO ($In_2O_3+SnO_2$) film having a thickness of 87 nm and an area of 0.25 cm² were formed on the 50 cm² portion by vacuum deposition, so that 50 small-area cells were obtained (cells of Example 1).

A dummy solar beam of AM 1.5 (100 mW/cm$^2$) was irradiated on these cells to evaluate the photoelectric conversion characteristics.

As a control, 50 small-area cells (Control 1 cells) without second p-layers 105 were formed to perform measurements following the same procedures as in Example 1.

As a result, in each Control 1 cell, the first p-layer contained the crystalline material, so a relatively high open circuit voltage V$_{oc}$ of about 0.970 V was obtained although this cell was a Si single cell. It was found that a higher open circuit voltage V$_{oc}$ was obtained in each cell of Example 1 which had the second p-layer on the first p-layer. The photoelectric conversion efficiency of the cells of Example 1 normalized to the values of the Control 1 cells was 1.18. It thus was confirmed that the cells of Example 1 were excellent in electrical characteristics.

Example 2

Example 2 is different from Example 1 in that the roll-to-roll film forming apparatus shown in FIG. 2 capable of continuously forming a semiconductor film on a band-like substrate is employed.

The layer structure of the photovoltaic cell of Example 2 was identical to that of Example 1.

The manufacturing process will be described below.

(1) A band-like stainless foil (12 cm (width)×200 m (length)×0.15 mm (thickness)) 207 was used as a substrate. A ZnO transparent conductive layer having a thickness of about 1 μm was stacked on the surface of this band-like substrate by sputtering. The band-like substrate had a slightly corrugated surface.

(2) The substrate prepared in step (1) was wound on the bobbin 208 and set in a substrate supply chamber 201.

(3) The band-like substrate was passed through the film forming chambers 202 to 204 through gas gates 206 to reach a substrate take-up chambers 205. A tension was applied to the band-like substrate so that the substrate was kept taut. After the band-like substrate was installed, the chambers 201 to 205 were evacuated.

(4) He gas was supplied to the chambers under vacuum evacuation. The interiors of the film forming chambers were heated and baked in the He atmosphere of about 200 Pa to a temperature of about 350° C.

(5) Upon heating and baking, H$_2$ as a gate gas was supplied to the respective gates 206 at 500 sccm, and raw material gases were supplied to the corresponding film forming chambers 202 to 204 at predetermined flow rates. The internal pressures of the respective chambers were set at predetermined pressures.

(6) The take-up bobbin 209 in the band-like substrate take-up chambers 205 was rotated to continuously move the band-like substrate 207 in a direction from the film forming chambers 202 to the film forming chamber 204 at a constant speed of 100 cm/min. Temperature controllers (not shown) arranged in the respective film forming chambers 202 to 204 performed temperature control such that the moving band-like substrate was set at predetermined temperatures in the film forming spaces of the respective film forming chambers.

(7) When the temperature of the band-like substrate was stabilized, a 13.56-MHz RF power and a 75-kHz low-frequency power were applied from power supplies (not shown) to the film forming chambers 202 and 203 and to the film forming chambers 204, respectively, through a matching device and a parallel plate electrode. Upon supply of the discharge power, the raw material gases in the film forming chambers 202 to 204 were converted into plasmas to form semiconductor films on the band-like substrate continuously moving in the film forming chambers.

The film forming chambers 204 had a structure shown in FIG. 3, in which the surface of the continuously moving band-like substrate was exposed to the plasma A on the gas exhaust side and then to the plasma B on the gas supply side, thereby forming a semiconductor film. In the film forming chambers 202 and 203, the gas supply side and the gas exhaust side were reversed relative to those in FIG. 3. The film forming chambers 204, i.e., the p-layer deposition chamber in FIG. 3, forms an amorphous silicon layer on the gas supply side and a microcrystalline silicon layer on the gas exhaust side. The crystal forms of the formed silicon layers were checked with RHEED patterns. It was confirmed that 80% of the film thickness was constituted by microcrystalline silicon, and the rest was constituted by amorphous silicon.

(7-1) A 10-nm thick n-layer 102 consisting of an n-type a-Si:H film was formed on the surface of the band-like substrate in the film forming chambers 202 by RF plasma CVD.

(7-2) A 120-nm thick i-layer 103 consisting of a substantially intrinsic a-Si:H film was formed on the n-layer 102 in the film forming chambers 203 by RF plasma CVD.

(7-3) A 10-nm thick first p-layer 104 consisting of a p-type μc-Si:H film was formed by low-frequency plasma CVD on the i-layer 103 in the plasma A on the gas exhaust side in the film forming chambers 204.

(7-4) A 2-nm thick second p-layer 105 consisting of a p-type a-Si:H film was formed by low-frequency plasma CVD on the first p-layer 104 in the plasma B on the gas supply side in the film forming chambers 204.

Table 2 shows the film forming conditions in steps (7-1) to (7-4).

TABLE 2

| Film Forming Chamber | 202 | 203 | 204 | |
| --- | --- | --- | --- | --- |
| | | | Gas Exhaust Side | Gas Supply Side |
| Semiconductor Layer | 102 | 103 | 104 | 105 |
| Forming Method | RF plasma CVD | RF plasma CVD | low-frequency plasma CVD | |
| Length of Semiconductor Forming Region (cm) | 60 | 200 | 70 | |
| Conductivity Type | n-type | i-type | first p-type | second p-type |
| Crystal Form | amorphous | amorphous | microcrystalline | amorphous |
| Material | Si | Si | Si | Si |
| Film Thickness (nm) | 10 | 120 | 10 | 2 |
| Raw Material Gas (sccm) | | | | |
| SiH$_4$ | 150 | 160 | | 5 |
| PH$_4$ | 15 | — | — | |
| BF$_3$ | — | — | | 0.1 |
| H$_2$ | 1800 | 2000 | | 2000 |
| Internal Pressure of Film Forming | 130 | 135 | | 130 |

TABLE 2-continued

| Film Forming Chamber | 202 | 203 | 204 Gas Exhaust Side | Gas Supply Side |
|---|---|---|---|---|
| Chamber (Pa) Substrate Temperature (° C.) | 300 | 250 | 100 | |
| Discharge Power (W) | RF 13.56 MHz 150 | RF 13.56 MHz 400 | low-frequency 75 kHz 600 | |

(8) The band-like substrate was continuously moved for 180 min. from the start of conveyance. During this period, the semiconductor layers were continuously formed for 170 min.

(9) After the semiconductor layers were formed for a length of about 170 m, the discharge power, flow of raw material gases, and heating of the band-like substrate and the film forming chambers were stopped, and the film forming chambers were purged. The band-like substrate and the interior of the apparatus were cooled, and the apparatus was opened. The band-like substrate wound on the bobbin 209 was removed from the band-like substrate take-up chambers 205.

Fifty small-area cells (cells of Example 2) were manufactured following the same procedures as in Example 1.

A dummy solar beam of AM 1.5 (100 mW/cm$^2$) was irradiated on these cells to evaluate the photoelectric conversion characteristics.

As a control, 50 small-area cells (Control 2 cells) were manufactured without stacking a second p-layer 105 by placing an elongated film forming opening adjustment plate 311 in the film forming chambers 204 to cover a portion on which amorphous silicon was to be formed. Measurements were performed following the same procedures as in Example 2.

Each Control 2 cell without the second p-layer had an open circuit voltage $V_{oc}$ of about 0.967 V, while each cell of Example 2 with the second p-layer of the present invention had a greater open circuit voltage $V_{oc}$ of 0.990 V. The photoelectric conversion efficiency of the cells of Example 2 normalized to the values of the Control 2 cells was 1.20. It thus was confirmed that the cells of Example 2 were excellent in electrical characteristics.

Example 3

Example 3 is different from Example 2 in that the photovoltaic cell had a three-layered structure in which three pin unit cells (FIG. 4) were stacked, and the p-layer located closest to the light incident side comprised first and second p-layers.

Figure 5:
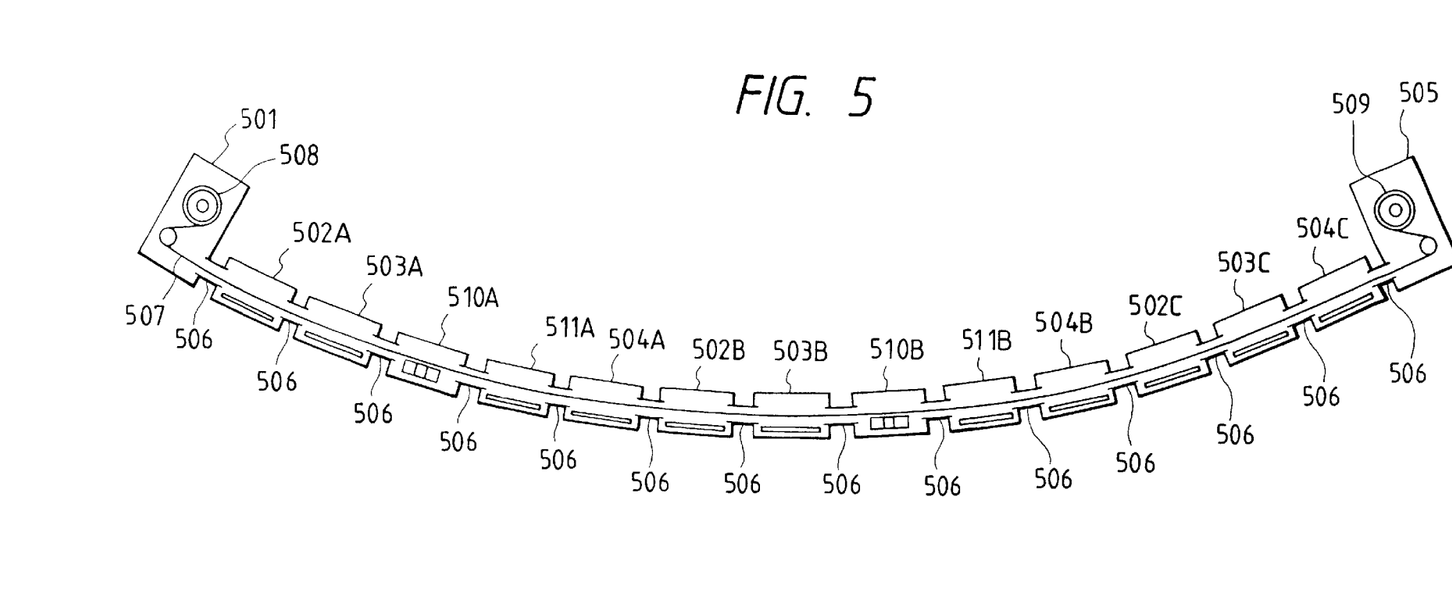
FIG. 5 is a view illustrating a roll-to-roll film forming apparatus used to manufacture the triple-cell photoelectric conversion element shown in FIG. 4.

A roll-to-roll film forming apparatus shown in FIG. 5 was used for continuously forming semiconductor films on a band-like substrate.

The manufacturing process will be described below.

Figure 4:
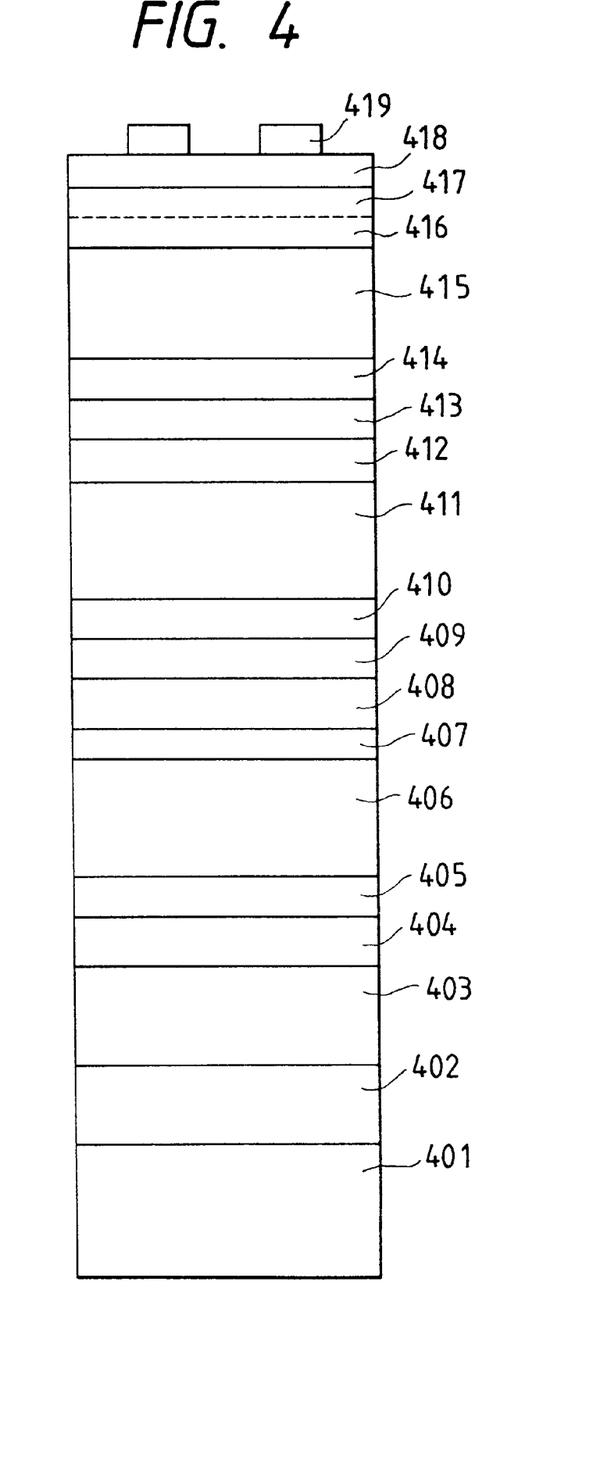
FIG. 4 is a sectional view illustrating a triple-cell photoelectric conversion element according to the present invention.

(1) A band-like SUS 430BA stainless steel plate (120 cm (width)×200 m (length)×0.15 mm (thickness)) 507 was used as a substrate. A 400-nm thick Ag layer and a 1-μm thick ZnO layer were formed as a conductive reflection layer 402 and a buffer layer 403 on the surface of the band-like substrate by DC sputtering. A band-like substrate having a slightly corrugated surface was thus prepared.

(2) The substrate prepared in step (1) was wound on a bobbin 508 and set in substrate supply chambers 501.

(3) The band-like substrate was passed through film forming chambers 502A to 504C through gas gates 506 to reach substrate take-up chambers 505. A tension was applied to the band-like substrate so that the substrate was kept taut. After the band-like substrate was installed, the chambers 501 to 505 were evacuated to a vacuum.

(4) He gas was supplied to the chambers under vacuum evacuation. The interiors of the film forming chambers were heated and baked in the He atmosphere of about 200 Pa at a temperature of about 350° C.

(5) Upon heating and baking, $H_2$ as a gate gas was supplied to the respective gates 506 at 500 sccm, and raw material gases were supplied to the corresponding film forming chambers 502A to 504C at predetermined flow rates. The internal pressure of the respective chambers were set at predetermined pressures.

(6) A take-up bobbin 509 in the take-up chambers 505 was rotated to continuously move the band-like substrate 507 in a direction from the film forming chambers 502A to the film forming chambers 504C at a constant speed of 100 cm/min Temperature controllers (not shown) arranged in the respective film forming chambers 502A to 504C performed temperature control such that the moving band-like substrate was set at predetermined temperatures in the film forming spaces of the respective film forming chamber.

Figure 6:
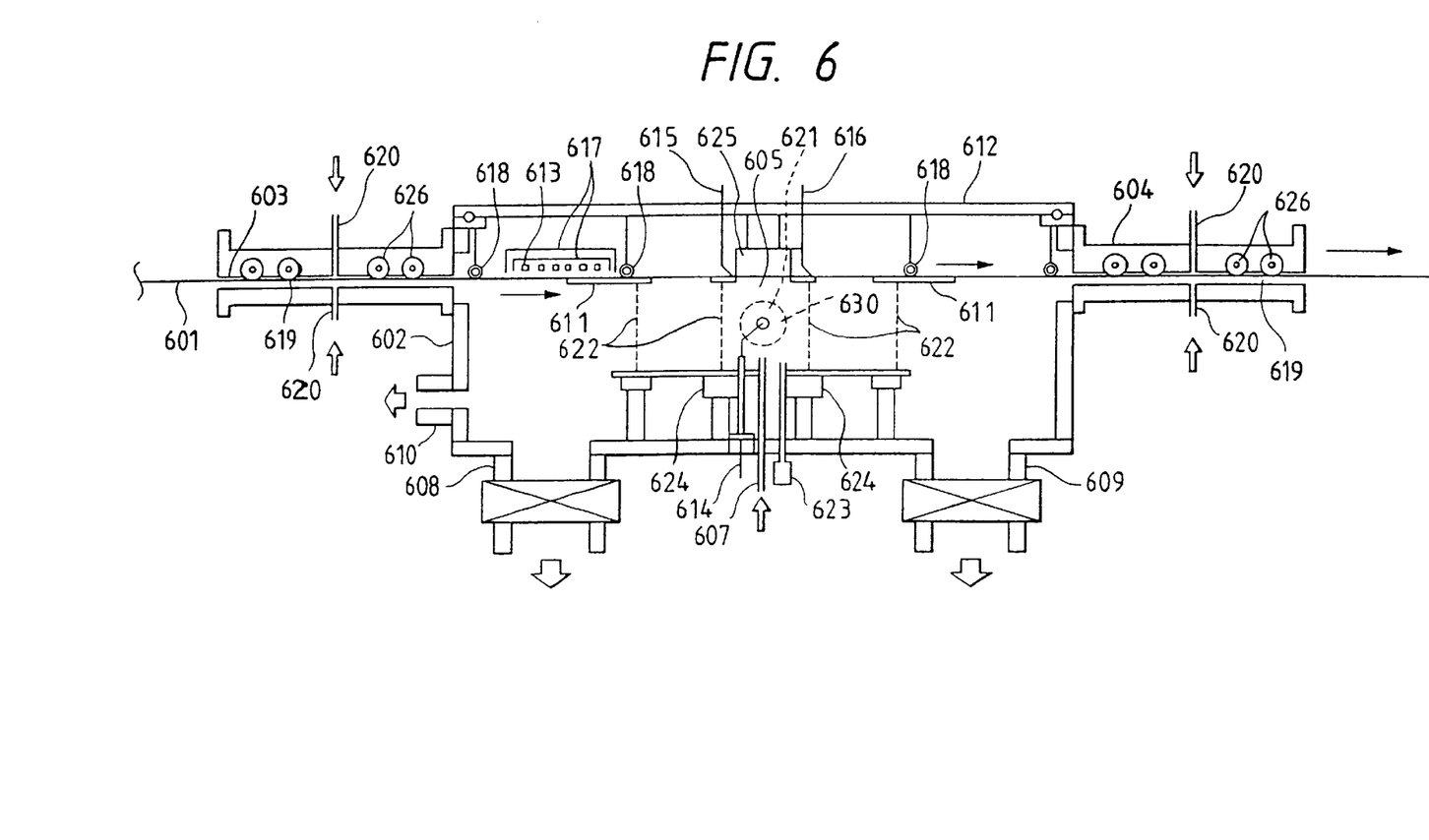
FIG. 6 is a view illustrating a microwave plasma CVD apparatus constituting part of the roll-to-roll film forming apparatus shown in FIG. 5.

(7) When the temperature of the band-like substrate was stabilized, 13.56-MHz RF power and a 75-kHz low-frequency power were applied from power supplies (not shown) to the film forming chambers 502A, 502B, 502C, 503A, 503B, 503C, 504A, and 504B and film forming chambers 511A and 511B and to the film forming chamber 504C, respectively, through a matching device and the parallel plate electrode. The structure of film forming chambers 510A or 510B is shown in FIG. 6.

A substrate 601 is supported and conveyed by a supporting roller 618. The substrate 601 is heated by a heater 613 converted with a heater housing 617. The temperature of the substrate 601 is monitored by thermometers 615 and 616, and is maintained at a desired temperature by a substrate temperature control device 625. A discharge space 605 is defined by a plate 622 with a hole, and by a film forming area opening adjustment plate 611. A film forming chamber is evacuated through exhaust pipes 608, 609 and 610 to a desired vacuum level, and is supplied with a material gas from a material gas introducing pipe 607 into the discharge space 605. Pressure within the film forming chamber is monitored by a pressure meter 623, and is maintained at a desired film forming pressure. Between adjacent film forming chambers, gas gates 603 and 604 are provided. The gas gate comprises a separating path 619, a supporting roller 626 supporting the substrate, and a sweep gas introducing pipe 620. 2.45-GHz microwave power was applied from a power supply (not shown) through a matching device (not shown) and a microwave introduction window 627 formed in one side wall of each of the film forming chambers 510A and 510B. 13.56-MHz RF power 614 was supplied from a power supply (not shown) through a matching device (not shown) and a rod-like bias electrode 630 arranged parallel to the band-like substrate 601 in front of the microwave introduction window. Upon supply of the discharge power, the raw material gases in the film forming chambers 502A to 504C were converted into plasmas to form semiconductor films on the band-like substrate continuously moving in the film forming chambers.

The file forming chambers 504A, 504B, and 504C had a structure shown in FIG. 3, that is, a structure in which the surface of the continuously moving band-like substrate was exposed to the plasma on the gas exhaust side and then to the plasma on the gas supply side, thereby forming a semiconductor film. In the film forming chambers 502A, 502B, 502C, 503A, 503B, 503C, 511A, and 511B, the gas supply side and the gas exhaust side were reversed with respect to those shown in FIG. 3.

(7-1) An n-layer 404 (film forming chambers 502A), an i-layer 405 (film forming chambers 503A), an i-layer 406 (film forming chambers 510A), an i-layer 407 (film forming chambers 511A), and a p-layer 408 (film forming chambers 504A) were sequentially formed as bottom cell layers 404 to 408 on the surface of the band-like substrate.

(7-2) An n-layer 409 (film forming chambers 502B), an i-layer 410 (film forming chambers 503B), an i-layer 411 (film forming chambers 510B), an i-layer 412 (film forming chambers 511B), and a p-layer 413 (film forming chambers 504B) were sequentially formed as middle cell layers 409 to 413 on the bottom cell.

(7-3) An n-layer 414 (film forming chambers 502C), an i-layer 415 (film forming chambers 503C), a first p-layer 416 (film forming chambers 504C), and a second p-layer 417 (film forming chambers 504C) were sequentially formed as top cell layers 414 to 417 on the middle cell.

The semiconductor layers having a nipnipnip structure were formed in steps (7-1) to (7-3). Table 3 shows the film forming conditions in the film forming chambers 502A to 504A in step (7-1). Table 4 shows the film forming conditions in the film forming chambers 502B to 504B in step (7-2). Table 5 shows the film forming conditions in the film forming chambers 502C to 504C in step (7-3).

TABLE 3

| Film Forming Chamber | 502A | 503A | 510A | 511A | 504A |
|---|---|---|---|---|---|
| Semiconductor Layer | 404 | 405 | 406 | 407 | 408 |
| Forming Method | RF plasma CVD | RF plasma CVD | microwave plasma CVD | RF plasma CVD | low-frequency plasma CVD |
| Length of Semiconductor Forming Region (cm) | 90 | 40 | 10 | 40 | 70 |
| Conductivity Type | n-type | i-type | i-type | i-type | p-type |
| Crystal Form | amorphous | amorphous | amorphous | amorphous | microcrystalline |
| Material | Si | Si | SiGe | Si | Si |
| Film Thickness (nm) | 10 | 10 | 120 | 10 | 10 |
| Raw Material Gas (sccm) | | | | | |
| SiH$_4$ | 90 | 30 | 45 | 30 | 5 |
| PH$_3$ | 80 | — | — | — | — |
| BF$_3$ | — | — | — | — | 0.1 |
| GeH$_4$ | — | — | 55 | — | — |
| H$_2$ | 500 | 600 | 200 | 600 | 2000 |
| Internal Pressure of Film Forming Chamber (Pa) | 130 | 135 | 1 | 135 | 120 |
| Substrate Temperature (° C.) | 300 | 280 | 300 | 220 | 100 |
| Discharge Power (W) | RF 13.56 MHz 90 | RF 13.56 MHz 75 | microwave 2.45 GHz 150 | RF 13.56 MHz 160 | low frequency 75 kHz 160 |
| Bias Power (W) | — | — | RF 13.56 MHz 600 | — | — |

TABLE 4

| Film Forming Chamber | 502B | 503B | 510B | 511B | 504B |
|---|---|---|---|---|---|
| Semiconductor Layer | 409 | 410 | 411 | 412 | 413 |
| Forming Method | RF plasma CVD | RF plasma CVD | microwave plasma CVD | RF plasma CVD | low-frequency plasma CVD |
| Length of Semiconductor Forming Region (cm) | 25 | 40 | 10 | 40 | 70 |
| Conductivity Type | n-type | i-type | i-type | i-type | p-type |
| Crystal Form | amorphous | amorphous | amorphous | amorphous | microcrystalline |
| Material | Si | Si | SiGe | Si | Si |
| Film Thickness (nm) | 10 | 10 | 120 | 10 | 10 |
| Raw Material Gas (sccm) | | | | | |
| SiH$_4$ | 30 | 30 | 40 | 30 | 5 |
| PH$_3$ | 80 | — | — | — | — |
| BF$_3$ | — | — | — | — | 0.1 |
| GeH$_4$ | — | — | 60 | — | — |
| H$_2$ | 500 | 600 | 200 | 600 | 2000 |
| Internal Pressure of Film Forming Chamber (Pa) | 130 | 135 | 1 | 135 | 130 |
| Substrate Temperature (° C.) | 300 | 280 | 300 | 220 | 100 |
| Discharge Power (W) | RF 13.56 MHz 60 | RF 13.56 MHz 75 | microwave 2.45 GHz 150 | RF 13.56 MHz 160 | low frequency 75 kHz 160 |
| Bias Power (W) | — | — | RF 13.56 MHz 600 | — | — |

TABLE 5

504C

| Film Forming Chamber | 502C | 503C | Gas Exhaust Side | Gas Supply Side |
|---|---|---|---|---|
| Semiconductor Layer | 414 | 415 | 416 | 417 |
| Forming Method | RF plasma CVD | RF plasma CVD | low-frequency plasma CVD | |
| Length of Semiconductor Forming Region (cm) | 60 | 200 | 70 | |
| Conductivity Type | n-type | i-type | first p-type | second p-type |
| Crystal Form | amorphous | amorphous | microcrystalline | amorphous |
| Material | Si | Si | Si | Si |
| Film Thickness (nm) | 10 | 100 | 10 | 2 |
| Raw Material Gas (sccm) | | | | |
| $SiH_4$ | 40 | 160 | 5 | |
| $PH_4$ | 15 | — | — | |
| $BF_3$ | — | — | 0.1 | |
| $H_2$ | 1800 | 2000 | 2000 | |
| Internal Pressure of Film Forming Chamber (Pa) | 130 | 135 | 130 | |
| Substrate Temperature (° C.) | 250 | 250 | 100 | |
| Discharge Power (W) | RF 13.56 MHz 80 | RF 13.56 MHz 400 | low-frequency 75 kHz 600 | |

(8) The band-like substrate was continuously moved for 180 min. from the start of conveyance. During this period, the semiconductor layers were continuously formed for 170 min.

(9) After the semiconductor layers were formed for a length of about 170 m, the discharge powers, flows of raw material gases, and heating of the band-like substrate and the film forming chambers were stopped, and the film forming chambers were purged. The band-like substrate and the interior of the apparatus were sufficiently cooled, and the apparatus was opened. The band-like substrate wound on the bobbin 509 was removed from the substrate take-up chambers 505.

Fifty small-area cells (cells of Example 3) were manufactured following the same procedures as in Example 1.

A dummy solar beam of AM 1.5 (100 mW/cm²) was irradiated on these cells to evaluate the photoelectric conversion characteristics.

As a control, 50 small-area cells (Control 3 cells) were manufactured without stacking a second p-layer 417 by elongating a film forming opening adjustment plate 311 in the film forming chambers 504 to cover a portion on which amorphous silicon was to be formed. Measurements were performed following the same procedures as in Example 3.

Each Control 3 cell without the second p-layer had an open circuit voltage $V_{oc}$ of about 2.113 V, while each cell of Example 3 with the second p-layer of the present invention had a greater open circuit voltage $V_{oc}$ of 2.136 V. The photoelectric conversion efficiency of the cells of Example 3 normalized to the values of the Control 3 cells was 1.12. It thus was confirmed that the cells of Example 3 were excellent in electrical characteristics.

As has been described above, according to the present invention, a photovoltaic cell having a high open circuit voltage ($V_{oc}$) and a high photoelectric conversion efficiency can be obtained. The photovoltaic cell of the present invention has a significantly improved photoelectric conversion efficiency and is industrially applicable as a photovoltaic cell such as a solar cell.

What is claimed is:

1. A method of producing a photovoltaic cell by moving an elongated substrate through an n-type layer forming chamber, an i-type layer forming chamber and a p-type layer forming chamber, thereby forming a photovoltaic cell having a p-i-n structure on the substrate by a plasma CVD process, wherein the p-type layer forming chamber comprises a gas supply pipe provided at a downstream side of a moving direction of the substrate, a gas exhaust pipe provided at an upstream side of the moving direction of the substrate and a discharging electrode, a single discharging space being formed within the p-type layer forming chamber, which comprises the steps of:

applying a low frequency power to the discharging electrode while a semiconductor raw material gas is supplied into the discharging space from the gas supply pipe, thereby generating in the discharging space a gas exhaust side plasma and a gas supply side plasma which are different from each other;

exposing the substrate to the gas exhaust side plasma to form a microcrystalline semiconductor layer on the substrate; and then exposing the substrate to the gas supply side plasma to form an amorphous semiconductor layer on the microcrystalline semiconductor layer.

2. A method according to claim 1, wherein the p-type layer forming chamber is provided with a plurality of substrate heating means arranged along and parallel to the moving direction of the substrate, and a distance between the adjacent substrate heating means is larger at the upstream side of the moving direction of the substrate than at the downstream side.

3. A method according to claim 1, wherein
   a frequency of a power to be supplied in forming said p-type layer is lower than a frequency of a power to be supplied in forming said n-type layer or said i-type layer.

4. A method according to claim 1, further comprising a step of,
   after exposing said elongated substrate to a gas supplying side plasma in said n-type layer forming chamber and/or said i-type layer forming chamber, exposing said substrate to a gas exhaust side plasma.

5. A method of forming a semiconductor layer on a substrate with a plasma CVD process, by using a chamber comprising an inlet and an outlet for moving the substrate which are arranged opposite to each other, a gas supply pipe provided at a side of the outlet, a gas exhaust pipe provided at a side of the inlet and a discharging electrode, a single discharging space being formed within the forming chamber, which comprises the steps of:

applying a low frequency power to the discharging electrode while a semiconductor raw material gas is supplied into the discharging space from the gas supply pipe, thereby generating in the discharging space a gas exhaust side plasma and a gas supply side plasma which are different from each other;

moving the substrate in the chamber through the inlet;

exposing the substrate moved in the chamber to the gas exhaust side plasma to form a microcrystalline semiconductor layer on the substrate;

then exposing the substrate as it moves to the gas supply side plasma to form an amorphous semiconductor layer on the microcrystalline semiconductor layer; and moving the substrate through the outlet to the outside of the chamber.

* * * * *

UNITED STATES PATENT AND TRADEMARK OFFICE
CERTIFICATE OF CORRECTION

PATENT NO. : 6,025,039
DATED : February 15, 2000
INVENTOR(S) : TAKAHIRO YAJIMA

It is certified that error appears in the above-identified patent and that said Letters Patent is hereby corrected as shown below:

ON TITLE PAGE AT [75] INVENTORS

"Soraku-gun" should read --Kyoto--.

COLUMN 14

Line 23, "A2-nm" should read --A 2-nm--.

Signed and Sealed this

Third Day of April, 2001

Attest:

NICHOLAS P. GODICI

Attesting Officer         Acting Director of the United States Patent and Trademark Office